US011476127B2

(12) United States Patent
Oohiraki et al.

(10) Patent No.: US 11,476,127 B2
(45) Date of Patent: Oct. 18, 2022

(54) MANUFACTURING METHOD OF ELECTRONIC-COMPONENT-MOUNTED MODULE

(71) Applicant: MITSUBISHI MATERIALS CORPORATION, Tokyo (JP)

(72) Inventors: Tomoya Oohiraki, Saitama (JP); Sotaro Oi, Suntogun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 17/040,817

(22) PCT Filed: Mar. 23, 2018

(86) PCT No.: PCT/JP2018/011686
§ 371 (c)(1),
(2) Date: Sep. 23, 2020

(87) PCT Pub. No.: WO2019/180913
PCT Pub. Date: Sep. 26, 2019

(65) Prior Publication Data
US 2021/0020456 A1 Jan. 21, 2021

(51) Int. Cl.
*H01L 21/48* (2006.01)
*H01L 21/56* (2006.01)
(52) U.S. Cl.
CPC ...... *H01L 21/4867* (2013.01); *H01L 21/4882* (2013.01); *H01L 21/565* (2013.01)
(58) Field of Classification Search
CPC ............ H01L 21/4867; H01L 21/4882; H01L 21/565
(Continued)

(56) References Cited

U.S. PATENT DOCUMENTS 6,310,775 B1    10/2001 Nagatomo et al.
2014/0252578 A1*  9/2014 Berlin ............... H01L 23/49513
                                                      257/676
(Continued)

FOREIGN PATENT DOCUMENTS

DE    102010001666 A1    8/2011
DE    102014203306 A1    8/2015
(Continued)

OTHER PUBLICATIONS

International Search Report dated May 22, 2018, issued for PCT/JP2018/011686.
(Continued)

*Primary Examiner* — Didarul A Mazumder
(74) *Attorney, Agent, or Firm* — Locke Lord LLP; James E. Armstrong, IV; Nicholas J. DiCeglie, Jr.

(57) ABSTRACT

A manufacturing method of an electronic-component-mounted module includes a step of forming a laminate of: a ceramic substrate board, a circuit layer made of aluminum or aluminum alloy on the ceramic substrate board, a first silver paste layer between the circuit layer and one surface of an electronic component, the electronic component, a lead frame made of copper or copper alloy, and a second silver paste layer between the other surface of the electronic component and the lead frame; and a step of batch-bonding bonding the circuit layer, the electronic component, and the lead frame at one time by heating the laminate to a heating temperature of not less than 180° C. to 350° C. inclusive with adding a pressure of 1 MPa to 20 MPa inclusive in a laminating direction on the laminate, to sinter the first and second silver paste layers and form first and second silver-sintered bonding layers.

12 Claims, 5 Drawing Sheets

(58) Field of Classification Search
USPC .......................................................... 438/123
See application file for complete search history.

(56) References Cited

U.S. PATENT DOCUMENTS

| | | | |
|---|---|---|---|
| 2016/0013073 A1* | 1/2016 | Terasaki | H01L 21/4853 |
| | | | 156/89.18 |
| 2016/0211195 A1* | 7/2016 | Sunachi | H01L 21/4878 |
| 2016/0343640 A1 | 11/2016 | Gohara et al. | |
| 2017/0117162 A1 | 4/2017 | Busche et al. | |
| 2017/0338176 A1 | 11/2017 | Tsuyuno et al. | |
| 2018/0151533 A1 | 5/2018 | Yoneda et al. | |

FOREIGN PATENT DOCUMENTS

| | | |
|---|---|---|
| DE | 102014206606 A1 | 10/2015 |
| EP | 3269491 A1 | 1/2018 |
| EP | 3276661 A1 | 1/2018 |
| EP | 3348337 A1 | 7/2018 |
| JP | 2001-291823 A | 10/2001 |
| JP | 2005-328087 A | 11/2005 |
| JP | 2006-269682 A | 10/2006 |
| JP | 2006-352080 A | 12/2006 |
| JP | 2014-60281 A | 4/2014 |
| JP | 2014107326 A | 6/2014 |
| JP | 2014-183213 A | 9/2014 |
| JP | 2014-204006 A | 10/2014 |
| JP | 2016-178334 A | 10/2016 |
| JP | 2017-34167 A | 2/2017 |
| JP | 2017-513241 A | 5/2017 |
| WO | 2016/021565 A1 | 2/2016 |
| WO | 2016/199621 A1 | 12/2016 |

OTHER PUBLICATIONS

Extended European Search Report issued in EP 18911062.0, dated Jan. 14, 2022.

Tanaka et al. "High Temperature Resistant Packaging for SiC Power Devices Using Interconnections Formed by Ni Micro-Electro-Planting and Ni Nano-particles", XP55373957—pp. 1371-1376 (2015).

* cited by examiner

MANUFACTURING METHOD OF ELECTRONIC-COMPONENT-MOUNTED MODULE

BACKGROUND OF THE INVENTION

Technical Field

The present invention relates to a method of manufacturing an electronic-component-mount module in which electronic components such as power components, LED elements, thermo-electric elements, and others are mounted on an insulation circuit substrate board.

Background Art

Among electronic-component-mounted modules, power modules used for a semiconductor device controlling high voltage and large electric current are necessary to deal with a large capacity of electric current and to reduce wiring resistance. For example, in Patent Document 1, a structure is used in which wirings connected to semiconductor components are formed from lead frames made of copper; bonding pats of electric components (power semiconductor components, controlling semiconductor components) and the lead frames (external lead frames, internal lead frames) are resin-sealed by epoxy resin and the like.

As shown in Patent Document 2 for example, for the electronic-component-mounted modules, an insulation circuit substrate board (a power module substrate board) is used in which a circuit layer made of an aluminum board and the like is bonded on one surface of an insulation substrate board such as aluminum nitride or the like; and a metal layer made of an aluminum board and the like is bonded the other surface. On this metal layer of the insulation circuit substrate board, a heat sink made of copper or the like is bonded.

As a method of manufacturing an electric-component-mounted module by bonding electronic components and lead frames on this insulation circuit substrate board, for example; a circuit layer and a metal layer are respectively joined on surfaces of a ceramic substrate board, and on this circuit layer, the electric components are joined by methods of silver sintering bonding and soldering. Then, on the electric components, the lead frames made of copper are joined by soldering or the like.

CITATION LIST

Patent Document

Patent Document 1: Japanese Unexamined Patent Application, First Publication No. 2001-291823
Patent Document 2: Japanese Unexamined Patent Application, First Publication No. 2005-328087

SUMMARY OF INVENTION

Technical Problem

In the above-described methods of manufacturing electronic-component-mounted module, warp may generated after mounting the electronic components, because the electronic components joined on one surface of the insulation circuit substrate board have small linear expansion coefficient. Owing to this warp, for example in a step of joining lead frames made of copper on the electronic components as shown in Patent Document 1, bonding defects and breakages of the electronic components may occur.

The present invention is achieved in consideration of the above circumstances, and has an object to manufacture electronic-component-mounted module easily by bonding the electronic components and the lead frames with reducing the warps, without the bonding defects and the breakages of the electronic components.

Solution to Problem

A manufacturing method of an electronic-component-mounted module of the present invention includes a step of forming a laminate in which a first silver paste layer is formed, wherein an insulation circuit substrate board has a ceramic substrate board and a circuit layer made of aluminum or aluminum alloy bonded on the ceramic substrate board, the first silver paste layer between the circuit layer and one surface of an electronic component; and a second silver paste layer made of silver paste is formed between the other surface of the electronic component and a lead frame made of copper or copper alloy, and a step of batch-bonding in which the circuit layer, the electronic component, and the lead frame are bonded at one time; wherein the laminate is heated to a heating temperature of not less than 180° C. and not more than 350° C. with adding a pressure of not less than 1 MPa and not more than 20 MPa in a laminating direction so as to sinter the first silver paste layer to form a first silver-sintered bonding layer which is the sintered first silver paste layer, and sinter the second silver paste layer to form a second silver-sintered bonding layer which is the sintered second silver paste layer.

In this manufacturing method, the lead frame is also bonded at one time when the electronic component is mounted on the circuit layer of the insulation circuit substrate board. The insulation circuit substrate board having the ceramic substrate and the lead frame made of copper or copper alloy have relatively high rigidity and are not easily deformed. The electronic component is bonded in a state of interposed between the insulation circuit substrate board and the lead frame and pressurized, so that the warp is reduced.

In a case in which bonding material between the circuit layer and the electronic component and bonding material between the electronic component and the lead frame are solder, liquid phase is generated by heating, so there is a concern in which the melted solder between the members is flowed out when pressurized in the laminating direction. Therefore, if the laminate is bonded without pressurizing, it is difficult to bond uniformly. By contrast, in a case in which the silver paste layers (the first silver paste layer and the second silver paste layer) are used, the liquid phase is not generated; the bonding is carried out by sintering. Accordingly, it is possible to act the pressure sufficiently on the laminate in the laminating direction. Moreover, the silver paste layers are effective to prevent the warp since sintering temperature (bonding temperature) is low.

If the pressure is less than 1 MPa, the bonding may be insufficient. If the pressure is more than 20 MPa, the electronic component may be broken. If the heating temperature is lower than 180° C., the silver paste layers cannot be sintered sufficiently. If the heating temperature is higher than 350° C., the electronic component may be broken. Since the circuit layer is made of aluminum or aluminum alloy, it buffers the pressure, so that relatively large pressure to 20 MPa can be acted without breaking the electronic component.

As a preferred aspect of the manufacturing method of electronic-component-mounted module of the present invention, the insulation circuit substrate board has a heat radiation layer made of aluminum or aluminum alloy bonded to the ceramic substrate board on an opposite surface to a bonded surface to the circuit layer, and a heat sink made of copper or copper alloy, bonded on the heat radiation layer.

The heat sink with high rigidity made of copper or copper alloy is provided on the insulation circuit layer substrate board, at the opposite side to the electronic component bonded on the circuit layer and to the lead frame bonded on the electronic component. Accordingly, the warp can be moreover prevented.

As a preferred aspect of the manufacturing method of an electronic-component-mounted module of the present invention, it is preferable that in the step of forming the laminate, a spacing member made of copper or copper alloy is arranged between the first silver paste layer and the circuit layer, and a third silver paste layer made of silver paste is formed between the spacing member and the circuit layer, and in the step of batch-bonding, the third silver paste layer is sintered by heating to the heating temperature in a state of being added the pressure on the laminate in the laminating direction, and a third silver-sintered bonding layer which is the sintered third silver paste layer is formed, and the insulation circuit substrate board, the spacing member, the electronic component, and the lead frames are bonded at one time.

As a preferred aspect of the manufacturing method of an electronic-component-mounted module of the present invention, it is preferable that in the step of forming the laminate, a spacing member made of copper or copper alloy is arranged between the second silver paste layer and the lead frame, and a third silver paste layer made of silver paste is formed between the spacing member and the lead frame, and in the step of batch-bonding, the third silver paste layer is sintered by heating to the heating temperature in a state of being added the pressure on the laminate in the laminating direction, and a third silver-sintered bonding layer which is the sintered third silver paste layer is formed, and the insulation circuit substrate board, the electronic component, the spacing member, and the lead frames are bonded at one time.

It is possible for the spacing member to adjust a height position (a position in the laminating direction) of the lead frame, so that the lead frame can be drawn out at an appropriate position. Since the spacing member is bonded on the electronic component, there is an effect of dispersing the heat of the electronic component quickly.

Advantageous Effects of Invention

According to the present invention, since the circuit layer of the insulation circuit layer substrate board, the electronic component, and the lead frame are bonded at one time, the problem of the warp in the electronic-component-mounted module is solved and it is possible to bond without bonding defect, the breakage of the electronic component, and the like. Moreover, since these are laminated and bonded at one time, the manufacture of the electronic-component-mounted module is facilitated.

DESCRIPTION OF EMBODIMENTS

Below, embodiments of the present invention will be explained referring drawings.

1. First Embodiment

Entire Structure

Figure 2B:
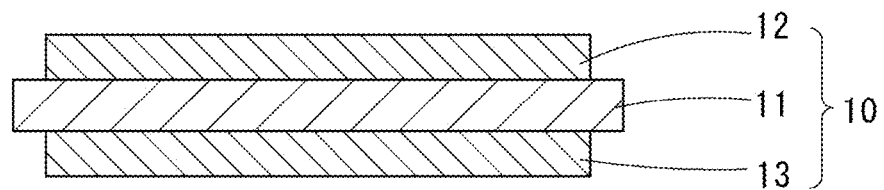
Figure 3:
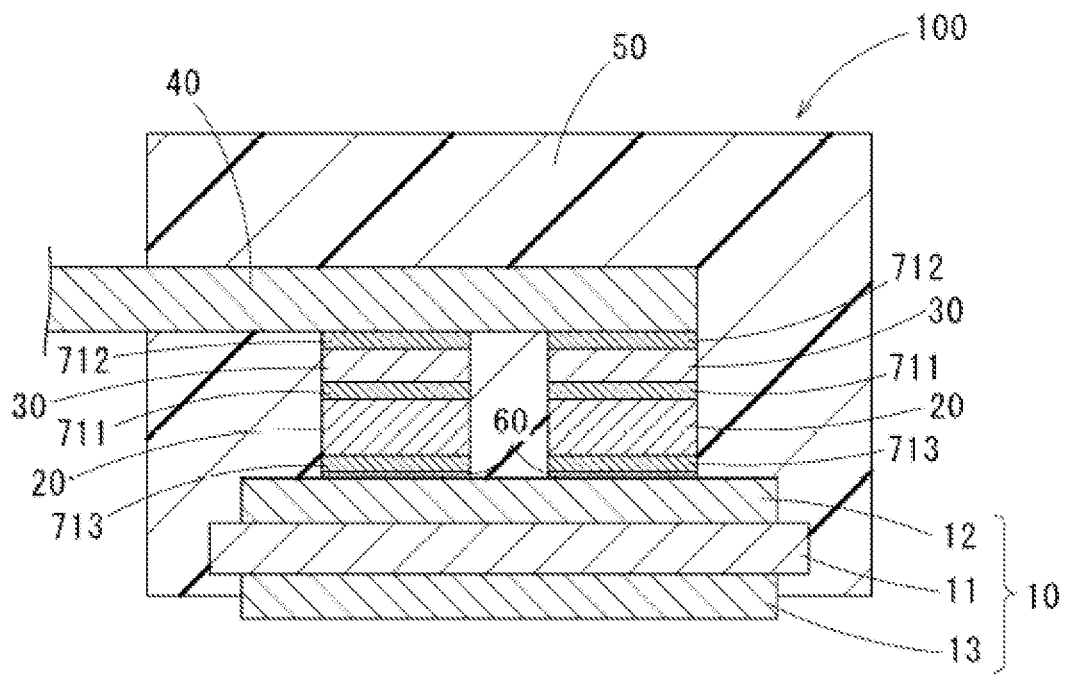
FIG. 3 It is a cross sectional view of a power module manufactured by the manufacturing method of the first embodiment.
Figure 3A:
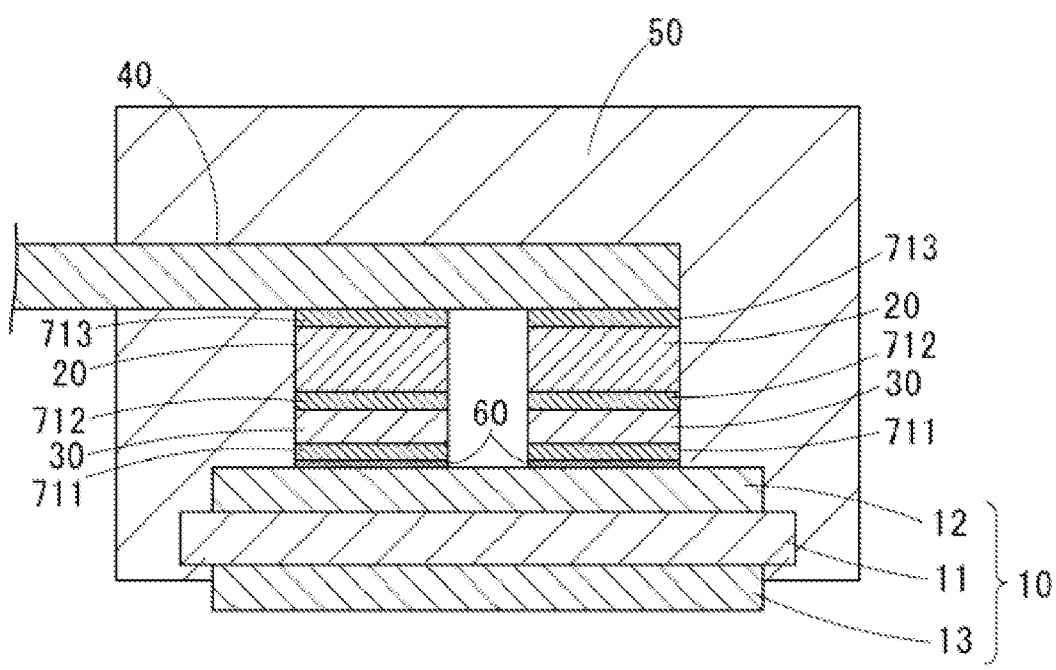
FIG. 3A It is a cross sectional view of a power module manufactured by the manufacturing method in which a spacing member made of copper or copper alloy is arranged between the second silver-sintered bonding layer and the lead frame, and a third silver-sintered bonding layer is formed between the spacing member and the lead frame.

A first embodiment explains an example of a power module 100 in which an electronic-component-mounted module is applied. A power module substrate board (an insulation circuit substrate board of the present invention) 10 used in the power module 100 is provided with a ceramic substrate board 11 which is an insulation layer, a circuit layer 12 formed on one surface thereof, and a heat radiation layer 13 formed on the other surface as shown in FIG. 2B. As shown in FIG. 3, mounting semiconductor components (electronic components of the present invention) 30 on a surface of the circuit layer 12 of the power module substrate board 10 with spacing members 20 therebetween and joining a lead frame 40 to the semiconductor components 30, the power module 100 is formed. Moreover, in the power module 100, molding resin 50 integrally seals the semiconductor components 30, the power module substrate board 10, and the lead frame 40.

For the ceramic substrate board 11 forming the power module substrate board 10, for example, nitride-type ceramics such as MN (aluminum nitride), $Si_3N_4$ (silicon nitride) or the like, or oxide-type ceramics such as $Al_2O_3$ (alumina) or the like can be used. A thickness of the ceramic substrate board 11 is 0.2 mm to 1.5 mm.

The circuit layer 12 and the heat radiation layer 13 are made of aluminum of purity 99.00% by mass or more (so-called 2 N aluminum), aluminum of purity 99.99% by mass (so-called 4 N aluminum), or aluminum alloy. Thickness of the circuit layer 12 and the heat radiation layer 13 is 0.1 mm to 5.0 mm, for example. The circuit layer 12 and the heat radiation layer 13 are formed to have generally a flat rectangular shape smaller than the ceramic substrate board 11. The circuit layer 12 and the heat radiation layer 13 are joined to the ceramic substrate board 11 by brazing material of Al—Si type, Al—Ge type, Al—Cu type, Al—Mg type, or Al—Mn type or the like. The circuit layer 12 and the heat radiation layer 13 are formed into desired shape by any of methods: punching them out into the desired shape by press-machining and then joining on the ceramic substrate board 11; or joining boards on the ceramic substrate board 11 and then forming them into the desired shape by etching.

The spacing members 20 are formed from blocks made of copper or copper alloy having electric conductivity. The spacing members 20 are provided between the circuit layer 12 and the semiconductor components 30 to adjust intervals between them and electrically connect them. In FIG. 3, the two spacing members 20 are joined on the circuit layer 12 aligned in a surface direction.

The semiconductor components 30 are electronic components having semiconductor. As the semiconductor components 30, in accordance with required functions, various semiconductor components such as IGBY (Insulated Gate Bipolar Transistor), MOSFET (Metal Oxide Semiconductor Field Effect Transistor), and FWD (Free Wheeling Diode) are selected. In the semiconductor components 30, electrodes are provided on an upper surface and a bottom surface, so that the circuit layer 12 and 40 are electrically connected. In FIG. 3, the semiconductor components 30 are joined to the two spacing members 20 respectively; and the lead frame is provided mutually connecting the semiconductor components 30.

The lead frame 40 are made of copper or copper alloy. The lead frame 40 are formed into a belt shape made of pure copper such as oxygen-free copper and tough-pitch copper, or copper alloy such as phosphor bronze for example, having a thickness 0.05 mm to 3.0 mm The spacing members 20, the semiconductor components 30, and the lead frame 40 are joined on the circuit layer 12 of the power module substrate board 10 with silver-sintered bonding layers 711 to 713 therebetween. As shown in FIG. 3, in the present embodiment, the silver-sintered bonding layers 712 to 713 are defined as: silver-sintered bonding layers bonding the semiconductor components 30 and the spacing members 20 are first silver-sintered bonding layers 711; silver-sintered bonding layers connecting the semiconductor components 30 and the lead frame 40 are a second silver-sintered bonding layers 712; and silver-sintered bonding layers bonding the spacing members 20 and the circuit layer 12 are the third silver-sintered bonding layers 713.

In order to connect the spacing members 20 by the third silver-sintered bonding layers 713, undercoat metal layers 60 made of gold (Au), silver (Ag), nickel (Ni) or the like are formed on a bonding surface of the circuit layer 12. Although illustration is omitted, also on surfaces of the spacing members 20, the semiconductor components 30, and the lead frame 40 which will be bonded, undercoat metal layers made of gold, silver, nickel and the like may be formed by plating, spattering, and the like.

The molding resin 50 is made of epoxy resin and the like. The molding resin 50 integrally seals the power module substrate board 10 excepting a back surface of the heat radiation layer 13: i.e., side surfaces of 13, the ceramic substrate board 11, the circuit layer 12, the spacing members 20, the semiconductor components 30 and the lead frame 40 at a vicinity of connection parts to the semiconductor components 30 are integrally sealed by the molding resin 50. An end of the lead frame 40 extends outside from the molding resin 50.

Manufacturing Method of First Embodiment

Figure 1:
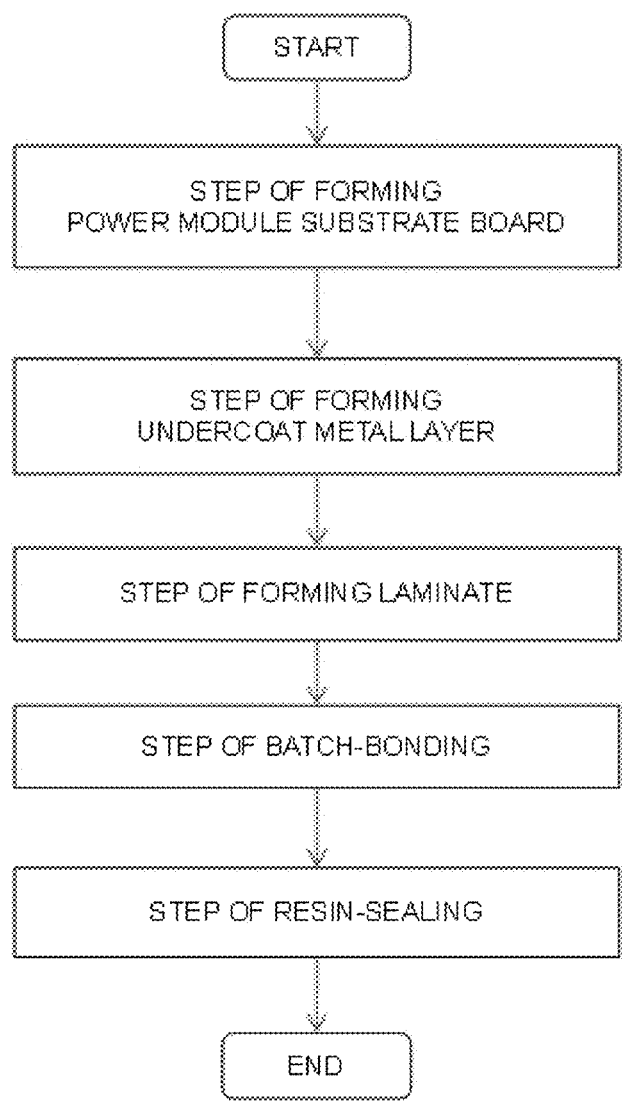
FIG. 1 It is a flow chart showing a manufacturing method of a power module according to a first embodiment of the present invention.

Next, a method of manufacturing the power module 100 structured as above will be explained. In this manufacturing method of power module, the power module substrate board 10 is formed as shown in FIG. 1 (a step of forming a power module substrate board); and the undercoat metal layers 60 are formed on a planned bonding surface of the circuit layer 12 of this 10 (a step of forming an undercoat metal layer). After that, a laminate in which the spacing members 20, the semiconductor components 30, and the lead frame 40 are laminated in order on the circuit layer 12 is formed (a step of forming a laminate); and the laminate is bonded in a batch (a step of batch-bonding); then it is resin-sealed by the molding resin 50 (a step of resin-sealing). Below, the process will be explained in order.

[Step of Forming Power Module Substrate Board]

Figure 2A:
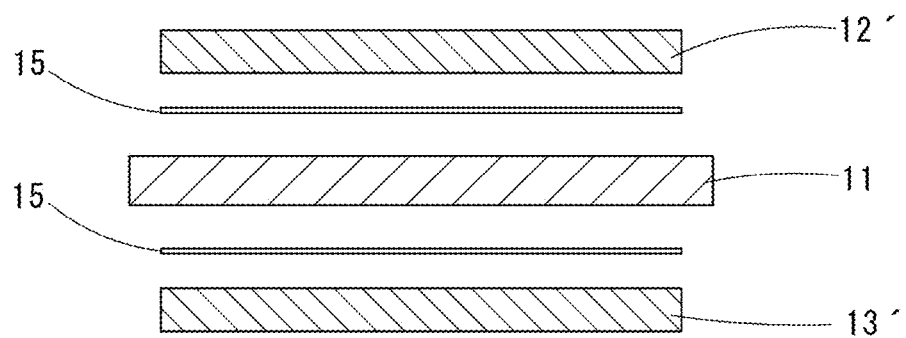
FIG. 2 It is a cross sectional view explaining a step of forming a power module substrate board in the manufacturing method of the first embodiment.
FIG. 2B It is a cross sectional view of the power module substrate board.
FIG. 2C It is a cross sectional view explaining a step of batch-bonding.
FIG. 2D It is a cross sectional view explaining a step of batch-bonding in which a spacing member made of copper or copper alloy is arranged between the second silver paste layer and the lead frame, and a third silver paste layer made of silver paste is formed between the spacing member and the lead frame.

As shown in FIG. 2A, on the surfaces of the ceramic substrate board 11, an aluminum board 12' which will be the circuit layer 12 and an aluminum board 13' which will be the heat radiation layer 13 are laminated respectively with brazing material 15 therebetween. A laminated structure body of these is heated in a pressurized state in a lamination direction to melt the brazing material 15, and bond the aluminum boards 12' and 13' to the ceramic substrate board 11: the power module substrate board 10 having the circuit layer 12 and the heat radiation layer 13 is formed (refer to FIG. 2B). Specifically, the laminated structure body is put into a furnace while pressurized, and heated in a vacuum atmosphere at temperature not lower than 610° C. and not higher than 650° C. for 1 to 60 minutes.

[Step of Forming Undercoat Metal Layer]

Before the step of forming a laminate, the undercoat metal layers 60 made of gold, silver, nickel or the like are formed on a planned bonding surface of the circuit layer 12. The undercoat metal layers 15 can be obtained by forming a thin film of gold, silver, nickel or the like by plating or spattering. The undercoat metal layers 60 on the surface of the circuit layer 12 also can be formed by applying and sintering glass-containing silver paste.

Method of Forming Undercoat Metal Layers by Glass-Containing Silver Paste

The method of forming the undercoat metal layers 60 by the glass-containing silver paste on the surface of the circuit layer 12 is explained. The glass-containing silver paste contains silver powder, glass (lead-free glass) powder, resin, solvent, and dispersing agent. Content of powder component consisting of the silver powder and the glass powder is not less than 60% by mass and not more than 90% by mass of the whole glass-containing silver paste; and the remainder are the resin, the solvent, and the dispersing agent. The silver powder has a particle size of not less than 0.05 μm and not more than 1.0 μm. For example, an average particle size is preferably 0.8 μm. The glass powder contains as a main ingredient, one or two or more from bismuth oxide ($Bi_2O_3$), zinc oxide (ZnO), boron oxide ($B_2O_3$), lead oxide ($PbO_2$), phosphorus oxide ($P_2O_5$); the glass powder has glass transition temperature not lower than 300° C. and not higher than 450° C., softening temperature not more than 600° C., and crystallization temperature not more than 450° C. For example, the glass powder is suitable to include lead oxide, zinc oxide, and boron oxide and have an average particle size 0.5 μm.

A weight ratio A/G, where a weight A is the silver powder and a weight G is the glass powder, is in a range of 80/20 to 99/1; e.g., A/G=80/5. The solvent is suitable to have the boiling point not less than 200° C.; for example, diethylene glycol dibutyl ether is used. The resin is for adjusting the viscosity of the glass-containing silver paste, and suitable if broken down at 350° C. or higher. For example, ethyl cellulose is used. The dispersing agent of dicarboxylic acid type is appropriately added. The glass-containing silver paste may be formed without the dispersing agent.

Premixing mixed powder of the silver powder and the glass powder and an organic mixture of the solvent and the resin with the dispersing agent by a mixer, kneading the obtained pre-mixture by a roll mill device, and filtering the obtained kneaded mixture by a paste filter, the glass-containing silver paste is made. This glass-containing paste is adjusted to have the viscosity not less than 10 Pa·s and not more than 500 Pa·s, more preferably, not less than 50 Pa·s and not more than 300 Pa·s.

Figure 4:
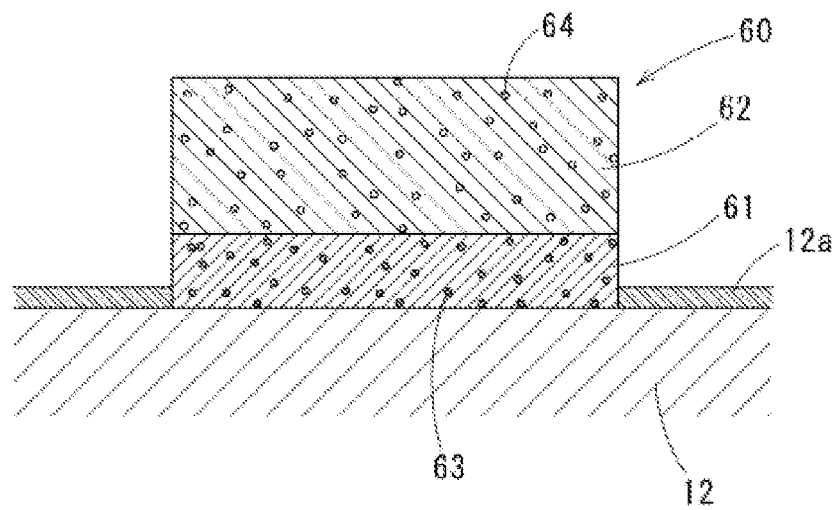
FIG. 4 It is an enlarged cross sectional view explaining an undercoat metal layer.

The glass-containing paste is applied on the planned bonding surface of the circuit layer 12 by screen printing or the like and dried, and sintered at temperature not less than 350° C. and not more than 645° C. for not less than 1 minute and not more than 60 minutes. As shown in FIG. 4, the undercoat metal layers 60 thereby is formed to have a double-layer structure of a glass layer 61 formed on the planned bonding surface side and a silver layer 62 formed on this glass layer 61. An aluminum oxide film 12a which has been spontaneously formed on the surface of the circuit layer 12 is melt and removed when the glass layer 61 is formed; so that the glass layer 61 is formed directly on the circuit layer 12 and the silver layer 62 is formed on this glass layer 61. The glass layer 61 is rigidly adhered on the circuit layer 12, so that the silver layer 62 is reliably held and fixed on the circuit layer 12.

Electric conductive particles (crystalline particles) 63 containing at least one of silver and aluminum are dispersed in the glass layer 61. The electric conductive particles 63 are supposed to be dispersed in the glass layer 61 while sintering. Minute glass particles 64 are dispersed also in the silver layer 64. The glass particles 64 are supposed to be flocculated remained glass composition in a process of sintering silver particles.

In the undercoat metal layer 60 formed as above, an average crystal particle size of the silver layer 62 is adjusted in a range of not less than 0.5 μm and not more than 3.0 μm. Here, if the heating temperature is less than 350° C. and the holding time is less than one minute, it is not sufficient to sinter and it is concerned that the undercoat metal layer 60 cannot be sufficiently formed. By contrast, if the heating temperature is more than 645° C. and the holding time at the heating temperature is more than 60 minutes, it is excessively sintered and it is concerned that the average crystal particle size of the silver layer 62 in the undercoat metal layer 60 is not in the range of not less than 0.5 μm and not more than 3.0 μm.

In order to reliably form the undercoat metal layer 60, it is preferable that a lower limit of the heating temperature while the heat treatment be not less than 400° C.; more preferably, not less than 450° C. The holding time at the heating temperature is preferably five minutes or longer; more preferably, ten minutes or longer. In contrast, in order to reliably suppress a progress of sintering, the heating temperature while the heat treatment is preferably 600° C. or lower; more preferably, 575° C. or lower. The holding time at the heating temperature is preferably 45 minutes or shorter; more preferably, 30 minutes or shorter.

[Step of Forming Laminate]

Figure 2C:
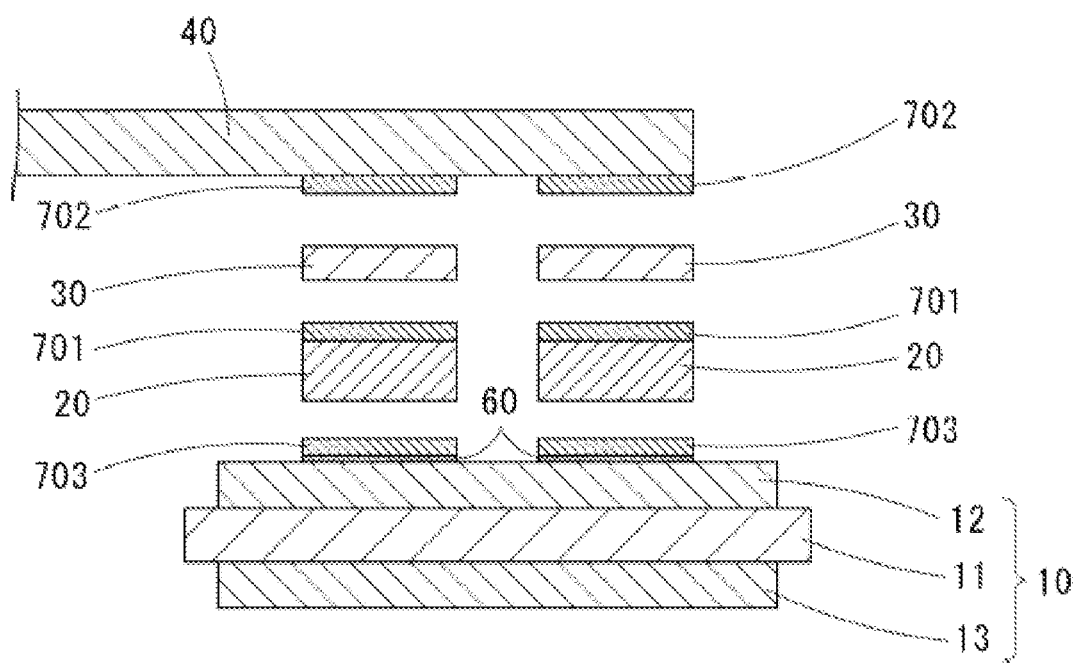
Figure 2D:
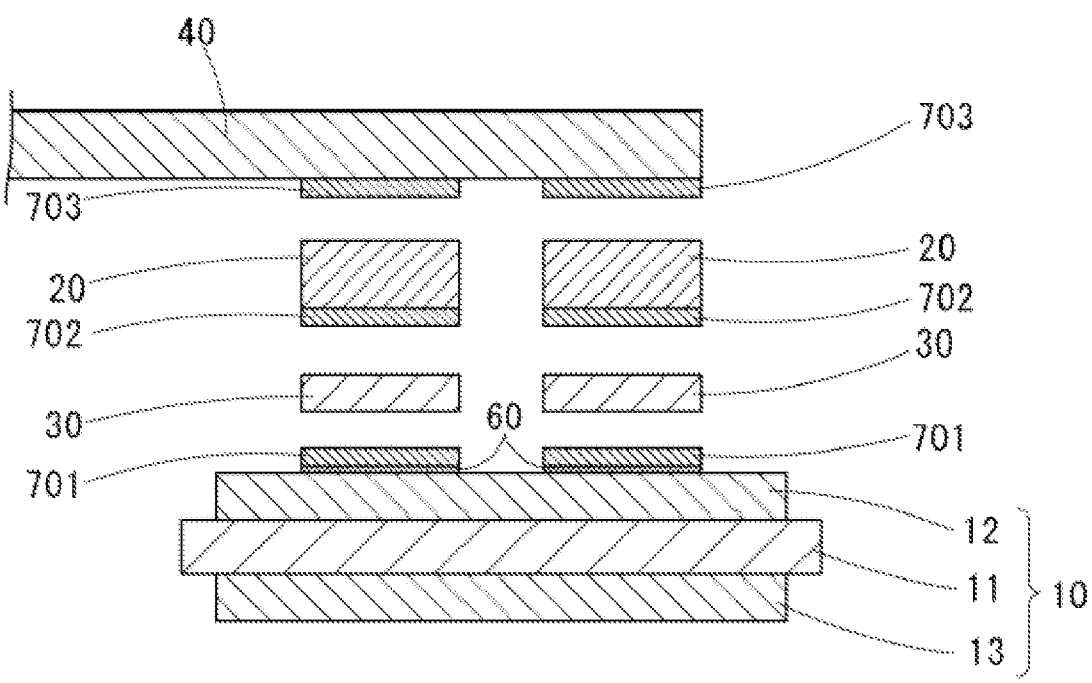

After the step of forming the undercoat metal layer, silver paste layers 701 to 703 made of silver paste are formed between the circuit layer 12 on which the undercoat metal layer 60 is formed, the spacing members 20, the semiconductor components 30, and the lead frame 40; and a laminate in which these are laminated is formed. As shown in FIG. 2C, these silver paste layers 701 to 703 are defined as: silver paste layers formed between the semiconductor components 30 and the spacing members 20 are first silver paste layers 701; silver paste layers formed between the semiconductor components 30 and the lead frame 40 are second silver paste layers 702; and silver paste layers formed between the spacing members 20 and the circuit layer 12 are third silver paste layers 703.

The silver paste layers 701 to 703 are layers formed by applying silver paste containing silver powder with a particle size 0.05 μm to 100 μm, resin, and solvent. For the resin used in the silver paste, ethyl cellulose or the like can be used. For the solvent used in the silver paste, α-terpineol or the like can be used. A composition of the silver paste is preferably as follows: a content of the silver powder is not less than 60% by mass and not more than 92% by mass of the whole silver paste; a content of the resin is not less than 1% by mass and not more than 10% by mass of the whole silver paste; and the remainder is the solvent.

Moreover, the silver paste can also contain organic metal compound powder of carboxylic acid type such as silver formate, silver acetate, silver propionate, silver benzoate, and silver oxalate at not less than 0% by mass and not more than 10% by mass of the whole silver paste. If necessary, a reducing agent such as alcohol, organic acid and the like may be contained with not less than 0% by mass and not more than 10% by mass of the whole silver paste. The viscosity of this silver paste is adjusted to not less than 10 Pa·s and not more than 100 Pa·s, more preferably not less than 30 Pa·s and not more than 80 Pa·s.

For example, as shown in FIG. 2C, this silver paste is applied on the undercoat metal layer 60 of the circuit layer 12, on the surface of the spacing members 20, on the surface of the lead frame 40 respectively by screen printing or the like and dried, thereby forming the silver paste layers 701 to 703. It is enough to form these silver paste layers 701 to 703 on any one of the planned bonding surfaces opposed to each other when bonding. In an example shown in FIG. 2C, the silver paste layers 701 to 703 are formed on the surface of the circuit layer 12, the surface of the spacing members 20 at a side facing to the semiconductor components 30, and the surface of the lead frame 40 at a side facing to the semiconductor components 30 respectively.

Silver paste in which silver oxide powder is substituted for the silver powder can be also used for the silver paste layers 701 to 703. This silver paste contains the silver oxide powder, the reducing agent, the resin, and the solvent, and further contains organic metal compound powder in addition to these. A content of the silver oxide powder is not less than 60% by mass and not more than 92% by mass of the whole silver paste; a content of the reducing agent is not less than 5% by mass and not more than 15% by mass of the whole silver paste; a content of the organic metal compound powder is not less than 0% by mass and not more than 10% by mass of the whole silver paste; and the remainder is the solvent.

As shown in FIG. 2C, a laminate is formed by stacking the spacing members 20 on the third silver paste layers 703 of the circuit layer 12, stacking the semiconductor components 30 on the first silver paste layers 701 of these 20, and stacking the second silver paste layers 702 of the lead frame 40 on the semiconductor components 30 so that these are in a state of stacked.

[Step of Batch-Bonding]

After the step of forming the laminate, the laminate is heated to the heating temperature of not lower than 180° C.

and not higher than 350° C. in a state of pressure is added in the laminating direction with not less than 1 MPa and not more than 20 MPa. It is sufficient that the holding time of the heating temperature is in a range not less than 1 minute and not more than 60 minutes. By this heat treatment, the silver paste layers 701 to 703 are sintered, and the silver-sintered bonding layers 711 to 713 are formed between the circuit layer 12, the spacing members 20, the semiconductor components 30, and the lead frame 40. Explaining in detail, the first silver paste layers 701 are sintered to form the first silver-sintered bonding layers 711 which are the sintered first silver paste layers 701; and the second silver paste layers 702 are sintered to form the second silver-sintered bonding layers 712 which are the sintered second silver paste layers 702. The third silver paste layers 703 are sintered to form the third silver-sintered bonding layers 713 which are the sintered third silver paste layers 703. The circuit layer 12, the spacing members 20, the semiconductor components 30, and the lead frame 40 are batch-bonded at the same time using these silver-sintered bonding layers 711 to 713.

In a case in which the silver paste layers 701 to 703 consisting of the silver paste including silver oxide and the reducing agent are used, when it is bonded (sintered), reduced silver particles which are precipitated by reducing the oxide silver become extremely minute as 10 nm to 1 μm of the particle diameter for example. Accordingly, the fine silver-sintered bonding layers 711 to 713 are formed, so that it is possible to join the circuit layer 12, the spacing members 20, the semiconductor components 30, and the lead frame 40 more rigidly.

[Step of Resin-Sealing]

As explained above, after the spacing members 20, the semiconductor components 30, and the lead frame 40 are joined on the power module substrate board 10; the molding resin 50 seals the power module substrate board 10, the spacing members 20, the semiconductor components 30, and the vicinity of the connecting parts of the lead frame 40 integrally, except for the bottom surface of the heat radiation layer 13 of the power module substrate board 10. Specifically, the molding resin 50 is formed by a transfer molding process using a sealing agent made of epoxy resin and seals them, for example. External end parts of the lead frame 40 are exposed from the molding resin 50.

In the power module 100 manufactured as above, since the semiconductor components 30 are joined between the rigid 10 and the lead frame 40 and pressurized, the warp can be reduced. Accordingly, without breaking the semiconductor components 30, it is possible to obtain a good joined state of the semiconductor components 30, the power module substrate board 10, the spacing members 20, and the lead frame 40. Moreover, it is possible to join the spacing members 20, the semiconductor components 30, and the lead frame 40 to the power module substrate board 10 at one time, the manufacture is facilitated.

2. Second Embodiment

Figure 5:
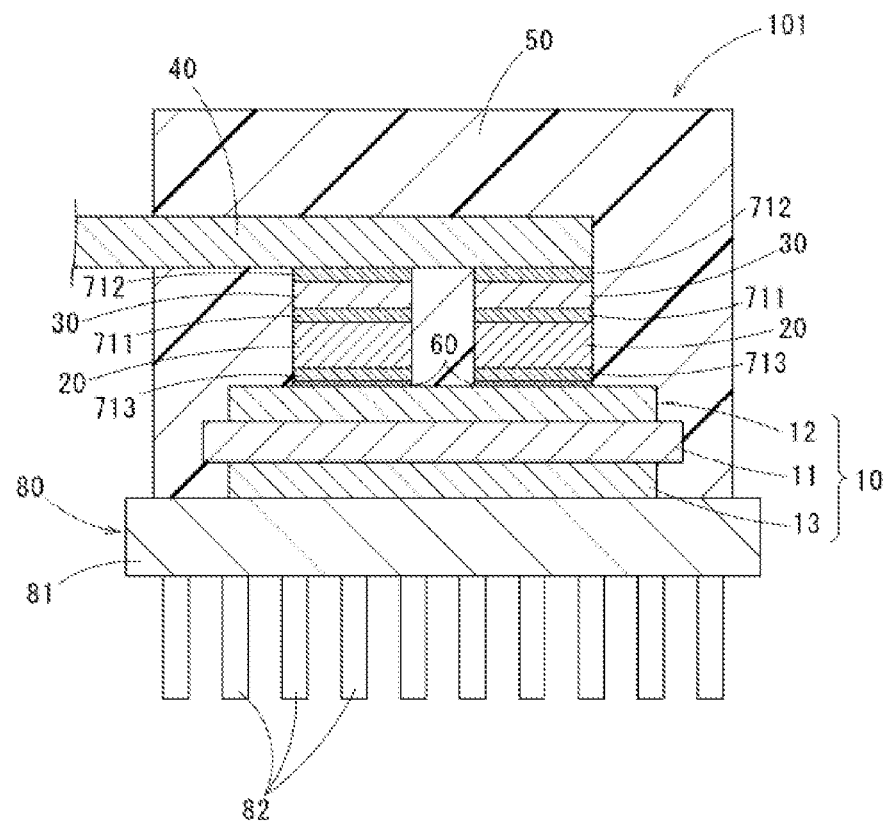
FIG. 5 It is a cross sectional view of a power module manufactured by the manufacturing method of a second embodiment of the present invention.

FIG. 5 shows a power module 101 of a second embodiment. In the power module 101 of this second embodiment, the power module substrate board 10 is provided with a heat sink 80. In this 10 having the heat sink 80, the heat sink 80 made of copper or copper alloy is joined on the heat radiation layer 13 of the same power module substrate board 10 as the first embodiment. The heat sink 80 is made of pure copper such as oxygen-free copper, tough-pitch copper or the like, or copper alloy such as Cu-Zr alloy or the like, for example.

The heat sink 80 has a flat-shaped top board part 81, and a large number of pin fins 82 which are formed integrally on the top board part 81 with protruding on one surface. A thickness of the top board part 81 is not less than 0.6 mm and not more than 6.0 mm The heat radiation layer 13 is bonded on a surface of the top board part 81 which is reverse to the pin fins 82, in this heat sink 80. The heat sink 80 and the heat radiation layer 13 are bonded by diffusion bonding. This diffusion bonding is carried out at temperature of not lower than 400° C. and not higher than 550° C. with adding a pressure of not less than 0.3 MPa and not more than 10 MPa in the stacking direction.

Also in a case of the power module substrate board 10 provided with the heat sink 80, while the illustration is omitted, as in the first embodiment, the circuit layer 12, the spacing members 20, the semiconductor components 30, the lead frame 40, and the silver paste layers 701 to 703 therebetween are formed and stacked, so that the laminate is formed [the step of forming the laminate]. The laminate is heated at temperature of not less than 180° C. and not more than 350° C. for a holding time of not less than 1 minute and not more than 60 minutes, in a state in which a pressure of not less than 1 MPa and not more than 20 MPa is added in the stacking direction, so that they are bonded at one time [the step of batch-bonding].

In addition, the undercoat metal layers 60 made of silver, nickel, or the like are formed on the circuit layer 12 made of aluminum or aluminum alloy before the batch-bonding. Although it is not necessary to form the undercoat metal layers 60 for the spacing members 20, the semiconductor components 30, and the lead frame 40, undercoat metal layers made of gold, silver, nickel or the like may be formed on the respective planned bonding surfaces in advance. After the step of batch-bonding, sealed up to the top surface of the top board part 81 of the heat sink 80 by the molding resin 50 [the step of resin-sealing], thereby the power module 101 shown in FIG. 5 is manufactured.

In a case of this power module 101 provided with the heat sink 80, since the rigidity of the heat sink 80 is high, the effect of preventing warp is higher.

In the example shown in FIG. 5, the structure of the heat sink 80 has the pin fins 82 on the top board part 81, while it is applicable for the heat sink 80 to have board-fins, perforated pipes in which cooling channels are formed by separation walls, or wave-board-fins provided in one flat channel, in place of the pin fins 82; alternatively, the top board part 81 may be a flat board without fins, and so on.

Besides that, the present invention is not limited to the above-described embodiments and various modifications may be made without departing from the scope of the present invention.

For example, although the spacing members 20 are provided in any of the embodiments, the spacing members are not necessary to be provided if it is not necessary to adjust the position of the lead frame 40.

Although the spacing members 20 are arranged between the first silver paste layers 701 and the circuit layer 12 in any of the embodiments, the spacing members 20 may be arranged between the second silver paste layers 702 and the lead frame 40. In this case, the third silver paste layers 703 are formed between the spacing members 20 and the lead frame 40 in the step of forming the laminate. Accordingly, sintering the third silver paste layers 703 in the step of batch-bonding, the third silver-sintered bonding layers which are the sintered third silver paste layers 703 can be formed; and the power module substrate board 10, the semiconductor components 30, the spacing members 20, and the lead frame 40 are bonded at one time.

EXAMPLES

Three types of power modules were made: a power module (Form 1) in which a semiconductor component and a lead frame were batch-bonded without spacing members on a circuit layer of a power module substrate board; a power module (Form 2) in which a semiconductor component and a lead frame were batch-bonded with interposing spacing members on a circuit layer of a power module substrate board; and a power module (Form 3) in which a semiconductor component and a lead frame were batch-bonded with interposing spacing members on a circuit layer of a power module substrate board provided with a heat sink.

For these power module substrate boards, a ceramic substrate board was aluminum nitride with a thickness 0.635 mm; the circuit layer was aluminum with a thickness 0.4 mm and a purity 99.99%; the spacing members were oxygen-free copper with a thickness 2.0 mm; the semiconductor component was a silicon chip with a thickness 0.15 mm; and the lead frame was oxygen-free copper with a thickness 1.0 mm.

Undercoat metal layers on a surface of the circuit layer was formed by the glass-containing silver paste described above: after applying the silver paste as shown in FIG. 2C, they were laminated and batch-bonded. Samples were made at different heating temperature while bonding and a pressure while bonding; and bondability, and existence of breakage of members and breakage of the semiconductor component (breakage of the component) were inspected.

Regarding the bondability, ultrasonic flaw detection images were obtained using an ultrasonic image measuring device made by Insight k.k.; it was "good" if a bonding ratio was 90% or higher, or it was "bad" if the bonding ratio was less than 90%.

The existence of the breakage of the members was inspected by observing a degree of deformation of the circuit layer, and judged "good" if it was normal, or "bad" if collapse was found at end parts.

Regarding the existence of the breakage of the semiconductor component, using the ultrasonic image measuring device made by Insight k.k., it was "good" if a ratio in which a crack was found in the semiconductor component was 10% or lower, or it was "bad" if the ratio in which a crack was found in the semiconductor component was more than 10%.

Results of these are shown in Table 1.

As known from Table 1, bonding at one time by adding the pressure of not less than 1 MPa and not more than 20 MPa at the heating temperature of not less than 180° C. and not more than 350° C., the bondability was good and the breakage of the member and the to semiconductor component was not found.

INDUSTRIAL APPLICABILITY

Since the circuit layer, the semiconductor components, and the lead frame are bonded at one time, the problem of warp is solved and it is possible to bond without bonding defects, the breakage of the semiconductor components and the like; moreover, these are stacked and bonded at one time, so that it is also facilitated to manufacture the electronic-component-mounted module.

REFERENCE SIGNS LIST

10 Power module substrate board
11 Ceramic substrate board
12 Circuit layer
13 Heat radiation layer
15 Brazing material
20 Spacing member
30 Semiconductor component
40 Lead frame
50 Molding resin
60 Undercoat metal layer
61 Glass layer
62 Silver layer
701 First silver paste layer
702 Second silver paste layer
703 Third silver paste layer
711 First silver-sintered bonding layer
712 Second silver-sintered bonding layer
713 Third silver-sintered bonding layer
80 Heat sink
100, 101 Power module (Electronic-component-mounted module)

The invention claimed is:
1. A manufacturing method of an electronic-component-mounted module comprising:
a step of providing an insulation circuit substrate board having a ceramic substrate board and a circuit layer made of aluminum or aluminum alloy bonded on the ceramic substrate board,

TABLE 1

| | Example | Form | Pressurizing Force MPa | Heating Temperature °C. | Bond-ability | Breakage Member | Breakage Component |
|---|---|---|---|---|---|---|---|
| Invention | 1 | 1 | 5 | 300 | Good | Good | Good |
| | 2 | 1 | 10 | 300 | Good | Good | Good |
| | 3 | 1 | 20 | 300 | Good | Good | Good |
| | 4 | 2 | 10 | 300 | Good | Good | Good |
| | 5 | 3 | 10 | 300 | Good | Good | Good |
| | 6 | 3 | 10 | 240 | Good | Good | Good |
| Comparative | 1 | 1 | 1 | 300 | Bad | Good | Good |
| | 2 | 1 | 30 | 300 | Good | Bad | Bad |
| | 3 | 1 | 10 | 380 | Good | Good | Bad |
| | 4 | 1 | 10 | 160 | Bad | Good | Good | a step of forming an undercoat metal layer, wherein the undercoat metal layer is formed by applying and sintering glass-containing silver paste on a bonding surface of the circuit layer, a step of forming a laminate in which a first silver paste layer is formed, the first silver paste layer between the undercoat metal layer and one surface of an electronic component; and a second silver paste layer made of silver paste is formed between the other surface of the electronic component and a lead frame made of copper or copper alloy, and a step of batch-bonding in which the circuit layer, the electronic component, and the lead frame are bonded at one time; wherein the laminate is heated to a heating temperature of not less than 180° C. and not more than 350° C. with adding a pressure of not less than 1 MPa and not more than 20 MPa in a laminating direction so as to sinter the first silver paste layer to form a first silver-sintered bonding layer which is the sintered first silver paste layer, and sinter the second silver paste layer to form a second silver-sintered bonding layer which is the sintered second silver paste layer, wherein in the step of forming the laminate, a spacing member made of copper or copper alloy is arranged between the second silver paste layer and the lead frame, and a third silver paste layer made of silver paste is formed between the spacing member and the lead frame, and in the step of batch-bonding, the third silver paste layer is sintered by heating to the heating temperature in a state of being added the pressure on the laminate in the laminating direction, and a third silver-sintered bonding layer which is the sintered third silver paste layer is formed, and the insulation circuit substrate board, the electronic component, the spacing member, and the lead frames are bonded at one time.

2. The manufacturing method of an electronic-component-mounted module according to claim 1, wherein the insulation circuit substrate board comprising a heat radiation layer made of aluminum or aluminum alloy bonded to the ceramic substrate board on an opposite surface to a bonded surface to the circuit layer, and a heat sink made of copper or copper alloy, bonded on the heat radiation layer.

3. The manufacturing method of an electronic-component-mounted module according to claim 1, wherein the thickness of the ceramic substrate board is 0.2 mm to 1.5 mm.

4. The manufacturing method of an electronic-component-mounted module according to claim 1, wherein the circuit layer is made of aluminum of purity 99.00% by mass or more.

5. The manufacturing method of an electronic-component-mounted module according to claim 1, wherein the circuit layer is made of aluminum of purity 99.99% by mass.

6. The manufacturing method of an electronic-component-mounted module according to claim 1, wherein the circuit layer is made of aluminum alloy.

7. The manufacturing method of an electronic-component-mounted module according to claim 2, wherein the heat radiation layer is made of aluminum of purity 99.00% by mass or more.

8. The manufacturing method of an electronic-component-mounted module according to claim 2, wherein the heat radiation layer is made of aluminum of purity 99.99% by mass.

9. The manufacturing method of an electronic-component-mounted module according to claim 2, wherein the heat radiation layer is made of aluminum alloy.

10. The manufacturing method of an electronic-component-mounted module according to claim 1, wherein the circuit layer is joined to the ceramic substrate board by brazing material of Al—Si, Al—Ge, Al—Cu, Al—Mg, or Al—Mn.

11. The manufacturing method of an electronic-component-mounted module according to claim 2, wherein the circuit layer and the heat radiation layer are joined to the ceramic substrate board by brazing material of Al—Si, Al—Ge, Al—Cu, Al—Mg, or Al—Mn.

12. The manufacturing method of an electronic-component-mounted module according to claim 1, wherein the lead frame has a thickness of 0.05 mm to 3.0 mm.

* * * * *